US011305985B2

(12) United States Patent
Sun et al.

(10) Patent No.: US 11,305,985 B2
(45) Date of Patent: Apr. 19, 2022

(54) MEMS DEVICE AND MANUFACTURING METHOD THEREOF

(71) Applicants: Hangzhou Silan Integrated Circuit Co., Ltd., Hangzhou (CN); Hangzhou Silan Microelectronics CO., LTD., Hangzhou (CN)

(72) Inventors: Wei Sun, Hangzhou (CN); Yongxiang Wen, Hangzhou (CN); Chen Liu, Hangzhou (CN); Junshan Ge, Hangzhou (CN); Zhijian Ma, Hangzhou (CN)

(73) Assignees: HANGZHOU SILAN INTEGRATED CIRCUIT CO., LTD., Hangzhou (CN); HANGZHOU SILAN MICROELECTRONICS CO., LTD., Hangzhou (CN)

( * ) Notice: Subject to any disclaimer, the term of this patent is extended or adjusted under 35 U.S.C. 154(b) by 93 days.

(21) Appl. No.: 16/633,244

(22) PCT Filed: Mar. 25, 2019

(86) PCT No.: PCT/CN2019/079574
§ 371 (c)(1),
(2) Date: Jan. 23, 2020

(87) PCT Pub. No.: WO2020/133756
PCT Pub. Date: Jul. 2, 2020

(65) Prior Publication Data
US 2020/0391996 A1    Dec. 17, 2020

(30) Foreign Application Priority Data
Dec. 29, 2018  (CN) .......................... 201811641765.8

(51) Int. Cl.
*H01L 41/04* (2006.01)
*B81B 7/02* (2006.01)
*H01L 41/047* (2006.01)

(52) U.S. Cl.
CPC .............. *B81B 7/02* (2013.01); *H01L 41/042* (2013.01); *H01L 41/0477* (2013.01); *B81C 2203/0771* (2013.01)

(58) Field of Classification Search
None
See application file for complete search history.

(56) References Cited

U.S. PATENT DOCUMENTS 5,914,507 A * 6/1999 Polla .................... H01L 41/0973
  257/254
9,796,582 B1   10/2017 Cheng et al.
(Continued)

FOREIGN PATENT DOCUMENTS

CN   106365106 A   2/2017
CN   108117037 A   6/2018
(Continued)

OTHER PUBLICATIONS

International Search Report and Written Opinion for International Application No. PCT/CN2019/079574, dated Aug. 23, 2019, 10 pages.

*Primary Examiner* — Benjamin P Sandvik
(74) *Attorney, Agent, or Firm* — Westman, Champlin & Koehler, P.A.

(57) ABSTRACT

A MEMS device and a manufacturing method thereof. The manufacturing method comprises: forming a CMOS circuit; and forming a MEMS module on the CMOS circuit which is coupling to the MEMS module and configured to drive the MEMS module. Forming the MEMS module comprises: forming a protective layer; forming a sacrificial layer in the protective layer; forming a first electrode on the protective (Continued)

layer and on the sacrificial layer so that the first electrode covers the sacrificial layer, and electrically coupling the first electrode to the CMOS circuit; forming a piezoelectric layer on the first electrode and above the sacrificial layer; forming a second electrode on the piezoelectric layer and electrically coupling the second electrode to the CMOS circuit; forming a through hole to reach the sacrificial layer; and forming a cavity by removing the sacrificial layer through the through hole.

30 Claims, 12 Drawing Sheets

(56) References Cited

U.S. PATENT DOCUMENTS

| | | | |
|---|---|---|---|
| 10,138,116 | B2 | 11/2018 | Cheng et al. |
| 10,472,233 | B2 | 11/2019 | Cheng et al. |
| 2006/0202779 | A1* | 9/2006 | Fazzio .................. H03H 9/0557 333/187 |
| 2010/0112233 | A1* | 5/2010 | Iwamoto .................. H03H 3/02 427/523 |
| 2011/0278993 | A1* | 11/2011 | Iwamoto ................. H03H 9/173 29/25.35 |
| 2013/0062996 | A1* | 3/2013 | Udayakumar ........ H01L 41/318 310/321 |
| 2015/0210540 | A1* | 7/2015 | Sadaka .................... H03H 9/10 438/24 |
| 2018/0148326 | A1 | 5/2018 | Cheng et al. |
| 2019/0055120 | A1 | 2/2019 | Cheng et al. |
| 2019/0140158 | A1* | 5/2019 | Eid ..................... H01L 41/0533 |
| 2019/0273116 | A1* | 9/2019 | Goktepeli ............ H03H 9/0561 |

FOREIGN PATENT DOCUMENTS

| | | |
|---|---|---|
| CN | 109678104 A | 4/2019 |
| CN | 109850840 A | 6/2019 |
| CN | 209815676 U | 12/2019 |
| WO | 2018/200666 A1 | 11/2018 |

* cited by examiner

MEMS DEVICE AND MANUFACTURING METHOD THEREOF

CROSS-REFERENCE TO RELATED APPLICATION

This application is a Section 371 National Stage application of International Application No. PCT/CN2019/079574, filed on Mar. 25, 2019, which has not yet published, and claims priority to Chinese Patent Application No. 201811641765.8, filed on Dec. 29, 2018, entitled as 'MEMS DEVICE AND MANUFACTURING METHOD THEREOF', the contents of which are incorporated herein by reference in their entireties.

BACKGROUND OF THE DISCLOSURE

Field of the Disclosure

The present disclosure relates to the field of semiconductor technology, and more particularly, to a MEMS device and a manufacturing method thereof.

Description of the Related Art

Currently, Micro Electro Mechanical Systems (MEMSs) and Integrated Circuits (ICs) are two most important domains in the development of the semiconductor industry. With the rapid development of global technology, the integration of MEMSs and the ICs has become an inevitable trend. and three integration methods consisting of monolithic integration, semi-hybrid (bonding) integration and hybrid integration are provided for implementing the integration. The monolithic integration refers to manufacture a MEMS structure and a CMOS device together on one chip. The Hybrid integration is that a MEMS structure and an IC chip are manufactured on different dies, then the dies are packaged in a single housing and the MEMS die with bumps is interconnected to the IC chip by use of flip-soldering or wire bonding manners to implement a SIP (System In a Package). The semi-hybrid integration is that, a MEMS structure and a CMOS device are integrated by 3D integration technology for implementing stereo integration. The monolithic integration is an important development direction for MEMS and IC integration technology, especially for Radio Frequency (RF) film bulk acoustic wave filters, it has many advantages. First, due to a processing circuit close to a microstructure, a higher precision for the detection and transmission of signals can be achieved; secondly, the size and power consumption of the integrated system are both reduced; third, the number of components and the number of package pins are both decreased, which improves the reliability.

In an existing manufacturing technology of RF MEMS film bulk acoustic wave filters, in most processes, a filter, a driving circuit and the processing circuit are packaged together by use of the SIP. In the SIP, several functional chips are integrated in one package, and the chips are coupling by bonding wires in a substrate. Interconnection of modules in the SIP are long and their integration density is low, which is unfavorable for the transmission of filter signals and make the manufacturing process cumbersome and unfavorable for integration. A few processes use a two-dimensional planar structure to integrate an IC circuit and a film bulk acoustic wave filter on one same plane in a single chip. These processes are cumbersome and lack of flexibility, especially, the MEMS process is limited by thermal cost of the CMOS device. However, compared with the SIP packaging manner, the processes which use the two-dimensional planar structure to integrate the IC circuit and the film bulk acoustic wave filter on one single chip, reduced the size of the integration system though complicated.

SUMMARY OF THE DISCLOSURE

In view of the above, an object of the present disclosure is to provide an MEMS device and a manufacturing method thereof, wherein, after the step of forming a stacked piezoelectric layer, a sacrificial layer and a through hole is used to form a cavity, and it ensures that the cavity will not deform due to the influence of the formation of the stacked piezoelectric layer.

On one aspect of the disclosure, there is provided a manufacturing method of a MEMS device, comprising: forming a CMOS circuit; and forming a MEMS module on the CMOS circuit which is coupling to the MEMS module and configured to drive the MEMS module, wherein, the step of forming the MEMS module comprises: forming a protective layer; forming a sacrificial layer in the protective layer; forming a first electrode on one of the protective layer and on the sacrificial layer so that the first electrode covers the sacrificial layer, and electrically coupling the first electrode to the CMOS circuit; forming a piezoelectric layer on the first electrode and above the sacrificial layer; forming a second electrode on the piezoelectric layer and electrically coupling the second electrode to the CMOS circuit; forming a through hole in the first electrode or in the protective layer to reach the sacrificial layer; and forming a cavity by removing the sacrificial layer through the through hole.

Preferably, the step of forming the sacrificial layer comprises:

forming an opening in the protective layer;
filling the opening with a sacrificial material; and
removing a part of the sacrificial material that is outside the opening.

Preferably, the sacrificial material comprises phosphosilicate glass.

Preferably, the manufacturing method further comprises: forming a first contact hole and a second contact hole in the protective layer before the step of forming the sacrificial layer, wherein, the first electrode is electrically coupling to the CMOS circuit through the first contact hole, and the second electrode is electrically coupling to the CMOS circuit through the second contact hole.

Preferably, the step of forming the first electrode comprises:

forming a first conductive layer on the protective layer and on the sacrificial layer; and
patterning the first conductive layer to form the first electrode, wherein a part of the first electrode is located in the first contact hole.

Preferably, the step of forming the second electrode comprises: forming a second conductive layer on the protective layer and on the piezoelectric layer; and patterning the second conductive layer to form the second electrode, wherein a part of the second electrode is located in the second contact hole.

Preferably, the step of forming the cavity comprises: removing the sacrificial layer though the through hole by a hydrofluoric acid vapor phase fumigation process.

Preferably, the piezoelectric layer covers a part of the first electrode and exposes the through hole.

Preferably, the step of forming the CMOS circuit comprises: forming a first transistor and a second transistor on a substrate; and sequentially forming a first dielectric layer, a first wiring layer, a second dielectric layer and a second wiring layer on the first transistor and the second transistor.

Preferably, the step of forming the CMOS circuit further comprises: forming a plurality of first interconnecting holes in the first dielectric layer before the step of forming the first wiring layer, and the step of forming the CMOS circuit further comprises: patterning the first wiring layer to form a plurality of first interconnecting leads each of which contacts the first transistor or the second transistor through one of the plurality of first interconnecting holes after the step of forming the first wiring layer.

Preferably, the step of forming the CMOS circuit further comprises: forming a plurality of second interconnecting holes in the second dielectric layer before the step of forming the second wiring layer, the step of forming the CMOS circuit further comprises: patterning the second wiring layer to form a plurality of second interconnecting leads each of which has one end connecting to one of the plurality of first interconnecting leads through one of the plurality of second interconnecting holes and the other end extending into the first contact hole and the second contact hole.

Preferably, the first transistor and the second transistor are coupling by one of the plurality of first interconnecting leads.

Preferably, the protective layer has an etching ratio greater than that of silicon dioxide.

Preferably, a material of the protective layer comprises silicon nitride.

Preferably, the protective layer has a thickness greater than 2 μm.

Preferably, the cavity has a depth ranging from 1 to 1.5 μm.

Preferably, a material of the first electrode and the second electrode comprises molybdenum, and a material of the piezoelectric layer comprises aluminum nitride.

Preferably, the first electrode has a thickness ranging from 0.5 to 0.8 μm, and the second electrode has a thickness less than or equal to 0.5 μm.

Preferably, the MEMS device comprises a film bulk acoustic wave filter.

On the other aspect of the disclosure, there is provided a MEMS device, comprising: a CMOS circuit;

a MEMS module being located on the CMOS circuit which is coupling to the MEMS module and configured to drive the MEMS module, and the MEMS module comprises:

a protective layer being located on the CMOS circuit;

a cavity being located in the protective layer;

a first electrode being located on the protective layer and the cavity, and configured to be electrically coupling to the CMOS circuit and to cover the cavity;

a piezoelectric layer being located on the first electrode and above the cavity;

a second electrode being located on the piezoelectric layer and configured to be electrically coupling to the CMOS circuit; and a through hole being located in the protective layer or in the first electrode to reach the cavity, wherein the piezoelectric layer exposes the through hole.

Preferably, the protective layer has a first contact hole and a second contact hole, a part of the first electrode is located in the first contact hole, the first electrode is electrically coupling to the CMOS circuit through the first contact hole, a part of the second electrode is located in the second contact hole, and the second electrode is electrically coupling to the CMOS circuit through the second contact hole.

Preferably, the CMOS circuit comprises: a substrate;

a first transistor and a second transistor being located on the substrate;

a first dielectric layer being located on the first transistor and on the second transistor;

a plurality of first interconnecting leads being located on the first dielectric layer;

a second dielectric layer being located on the plurality of first interconnecting leads; and a plurality of second interconnecting leads being located on the second dielectric layer.

Preferably, the first dielectric layer has a plurality of first interconnecting holes, and each of the first interconnecting leads contacts the first transistor or the second transistor through one of the plurality of first interconnecting holes, the second dielectric layer has a plurality of second interconnecting holes, and each of the plurality of second interconnecting leads has one end connecting to one of the plurality of first interconnecting leads through one of the plurality of second interconnecting holes and the other end extending to the first contact hole and the second contact hole.

Preferably, the first transistor and the second transistor are coupling by one of the plurality of first interconnecting leads.

Preferably, the protective layer has an etching ratio greater than that of silicon dioxide.

Preferably, a material of the protective layer comprises silicon nitride.

Preferably, the protective layer has a thickness greater than 2 μm.

Preferably, the protective layer has a depth ranging from 1 to 1.5 μm.

Preferably, a material of the first electrode and the second electrode comprises molybdenum, and a material of the piezoelectric layer comprises aluminum nitride.

Preferably, the first electrode has a thickness of 0.5 μm, and the second electrode has a thickness less than 0.5 μm.

Preferably, the MEMS device comprises a film bulk acoustic wave filter.

According to the MEMS device and the manufacturing method thereof provided by the embodiments of the disclosure, an integrated structure of the CMOS circuit and the MEMS device at the vertical direction of the single chip is formed by stacking the MEMS module on the COMS circuit, due to no need for adopting eutectic bonding to connect different dies, the manufacturing process is simplified, the manufacturing cost and total chip size are reduced, which facilities the integration, reduces the power consumption, decreases the number of package pins, and improve the device reliability. In the manufacturing method, by pre-forming the sacrificial layer in the protective layer and removing the sacrificial layer through the through hole in the first electrode or the protective layer after the step of forming the stacked piezoelectric layer, the cavity is formed, so that the shape of the cavity is ensured. Compared with the prior art, this manufacturing method does not affect the shape of the cavity when the stacked piezoelectric layer is formed.

In a preferred embodiment, the MEMS device is a film bulk acoustic wave filter, and the precision of filtered signals is further improved due to a small distance between the COMS circuit and the filter.

The MEMS device has a high sensitivity, reduced cost, and improved process compatibility.

BRIEF DESCRIPTION OF THE DRAWINGS

Exemplary embodiments of the present disclosure will be described in more details below with reference to the accompanying drawings.

DETAILED DESCRIPTION OF THE DISCLOSURE

Figure 1:
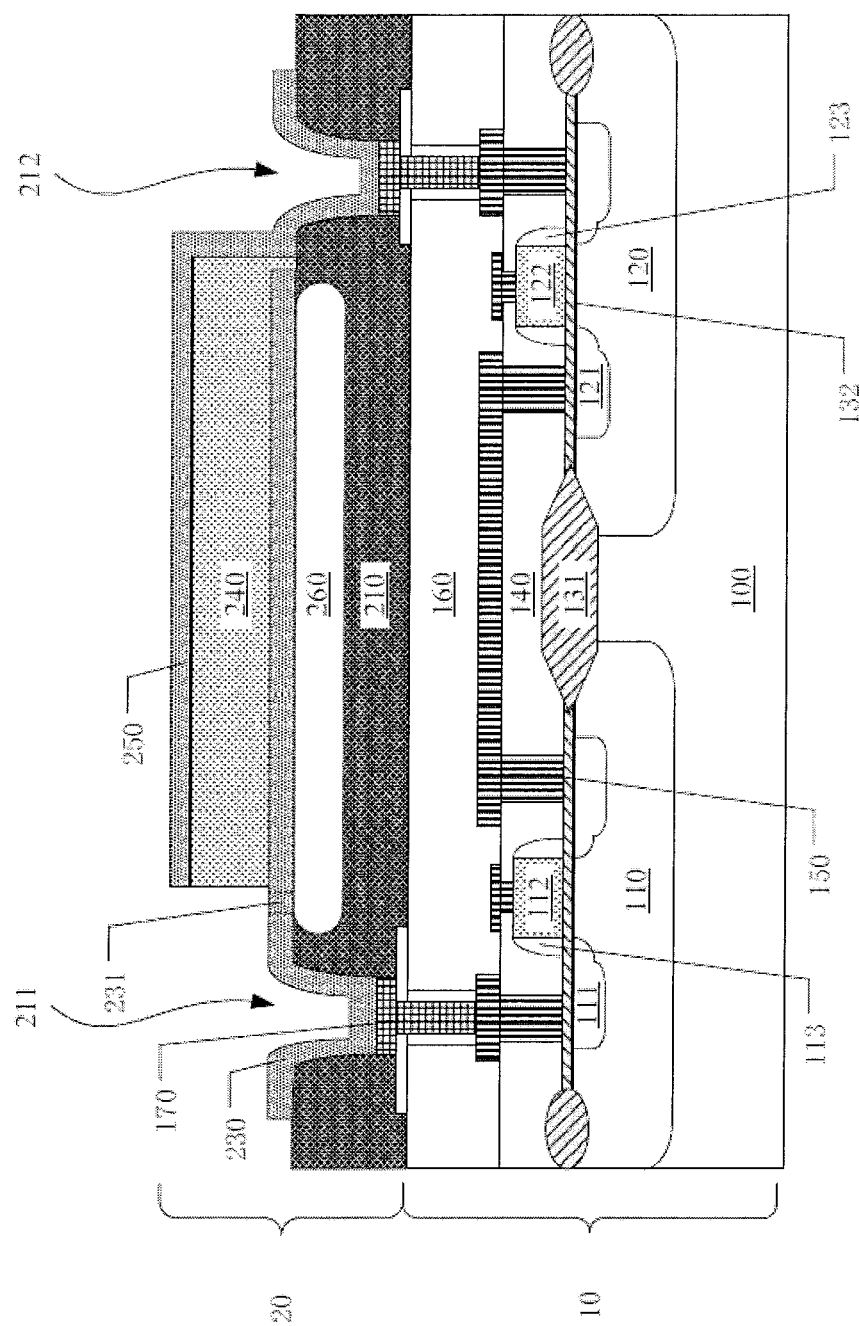
FIG. 1 shows a schematic cross-sectional diagram of a MEMS device in accordance with an embodiment of the present disclosure.

Exemplary embodiments of the present disclosure will be described in more details below with reference to the accompanying drawings. In the drawings, like reference numerals denote like members. The figures are not drawn to scale, for the sake of clarity. In addition, some well-known parts may not be shown in the figures.

Many specific details of the present disclosure are described below, such as the structures, materials, dimensions, processes, and techniques of the parts, in order to more clearly understand the present disclosure. However, one skilled in the art will understood that the present disclosure may be practiced without these specific details.

The present disclosure may be presented in various forms, some of which will be described below.

FIG. 1 shows a schematic cross-sectional diagram of a MEMS device in accordance with an embodiment of the present disclosure.

As shown in FIG. 1, the MEMS device provided in accordance with the embodiment of the present disclosure includes: a CMOS circuit 10 and a MEMS module 20 being located on the CMOS circuit 10, wherein the CMOS circuit 10 is coupling to the MEMS module 20 and is configured to drive the MEMS module 20. Preferably, the MEMS device in the embodiment is a film bulk acoustic wave filter. The CMOS circuit 10 includes a substrate 100, a first well region 110, a first source/drain region 111, a first gate conductor 112, a first sidewall 113, a second well region 120, a second source/drain region 121, a second gate conductor 122, a second sidewall 123, a field oxide region 131, a gate oxide layer 132, a first dielectric layer 140, a plurality of first interconnecting leads 150, a second dielectric layer 160, and a plurality of second interconnecting leads 170. The MEMS module 20 includes a protective layer 210 having a first contact hole 211 and a second contact hole 212, a first electrode 230, a piezoelectric layer 240, a second electrode 250, and a cavity 260. The first electrode has a through hole reaching the cavity 260. The piezoelectric layer 240 covers a part of the first electrode 230 and exposes the through hole. In some other embodiments, the through hole may also be formed directly in the protective layer 210 to reach the cavity 260.

The first well region 110, the first source/drain region 111, the first gate conductor 112, and the first sidewall 113 constitute a first transistor. The second well region 120, the second source/drain region 121, the second gate conductor 122 and the second sidewall 123 constitute a second transistor. The first transistor and the second transistor are located in the substrate 100. However, embodiments of the present disclosure are not limited thereto, and those skilled in the art may set other numbers of transistors as necessary.

The first dielectric layer 140 is located on the first transistor and on the second transistor. The first dielectric layer 140 has a plurality of first interconnecting holes, a plurality of first interconnecting leads 150 are located on the first dielectric layer 140, and each of the plurality of first interconnecting leads 150 contacts the first transistor or the second transistor through one of the plurality of first interconnecting holes, and the first transistor and the second transistor are coupling by one of the plurality of first interconnecting leads 150.

The second dielectric layer 160 is located on the plurality of first interconnecting leads 150, the second dielectric layer 160 has a plurality of second interconnecting holes, and the plurality of second interconnecting leads 170 are located on the second dielectric layer 160, and each of the plurality of second interconnecting leads 170 has one end being coupling to one of the plurality of first interconnecting leads 150 through one of the plurality of second interconnecting holes and the other end extending into the first contact hole 211 and the second contact hole 212.

The protective layer 210 is located on the CMOS circuit 10, wherein the etching ratio of the protective layer 210 is greater than that of silicon dioxide. In some preferred embodiments, the material of the protective layer 210 include silicon nitride, and the protective layer 210 has a thickness greater than 2 µm.

The cavity 260 is located in the protective layer 210, wherein the cavity 260 has a depth ranging from 1 to 1.5 µm.

The first electrode 230 is located on the protective layer 210 and the cavity 260 and covers the cavity 260. The first electrode 230 is electrically coupling to the CMOS circuit 10. Specifically, a part of the first electrode 230 is located in the first contact hole 211, and the first electrode 230 is coupling to one of the plurality of second interconnecting leads 170 through the first contact hole 211 so that the first electrode 230 is electrically coupling to the CMOS circuit 10, wherein the material of the first electrode 230 comprises molybdenum and it has a thickness ranging from 0.5 to 0.8 µm.

The piezoelectric layer 240 is located on the first electrode 230. The piezoelectric layer 240 above the cavity 260 and exposes the through hole. The material of the piezoelectric layer 240 includes aluminum nitride.

The second electrode 250 is located on the piezoelectric layer 240 and is electrically coupling to the CMOS circuit 10. Specifically, a part of the second electrode 250 is located in the second contact hole 212, and the second electrode 250 is coupling to one of the plurality of second interconnecting leads 170 through the second contact hole, so that the second electrode 250 is electrically coupling to the CMOS circuit 10, wherein the material of the second electrode 250 includes molybdenum, and the second electrode 250 has a thickness less than 0.5 µm.

In the present embodiment, the first contact hole 211, the corresponding first interconnecting lead 150, the corresponding second interconnecting lead 170, and the first source/drain region 111 of the first transistor are corresponding in position at the vertical direction of the MEMS device. The second contact hole 212, the corresponding first interconnecting lead 150, the corresponding second interconnecting lead 170, and the second source/drain regions of the second transistor are corresponding in position at the vertical direction of the MEMS device. Thus, an integrated structure of the CMOS circuit and the MEMS module in the vertical direction of the single chip is formed, due to no need for adopting eutectic bonding to connect different dies, the manufacturing process is simplified and the manufacturing cost is reduced.

Figure 2:
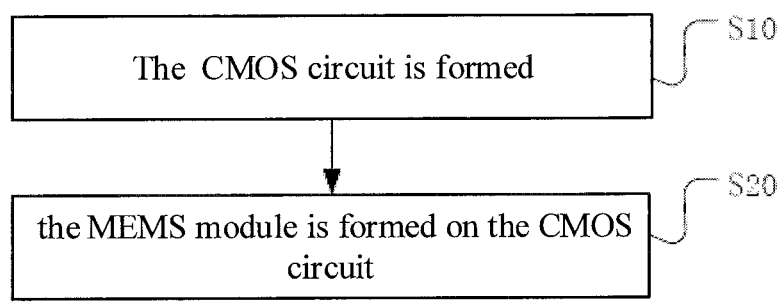
FIG. 2 is a schematic diagram showing a manufacturing method of a MEMS device in accordance with an embodiment of the present disclosure.
Figure 3:
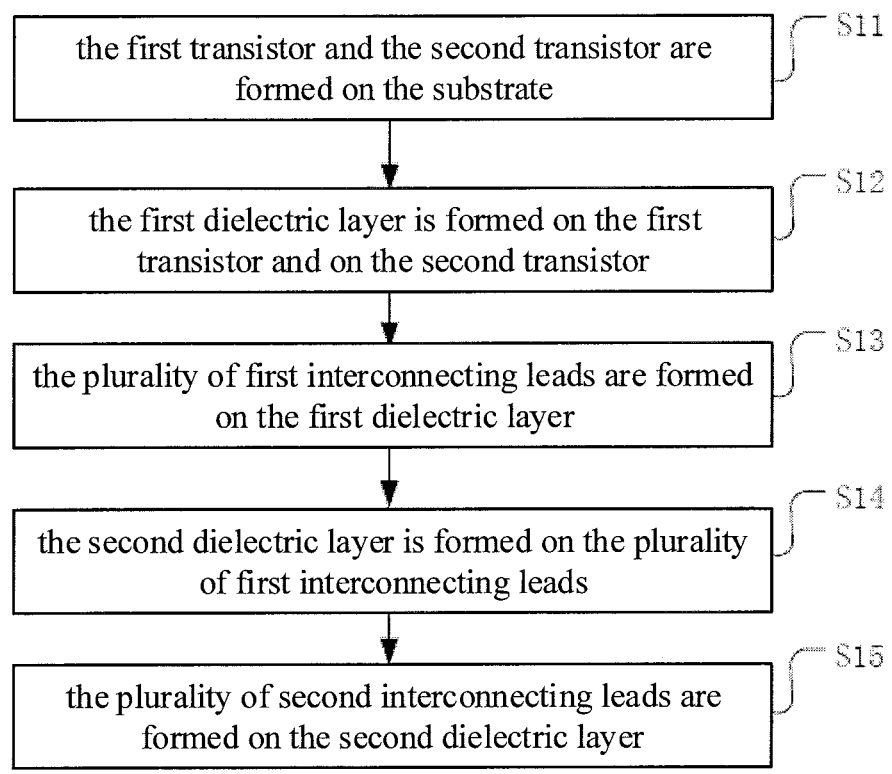
FIG. 3 is a schematic diagram showing a manufacturing method of the CMOS circuit provided in FIG. 2.
Figure 4:
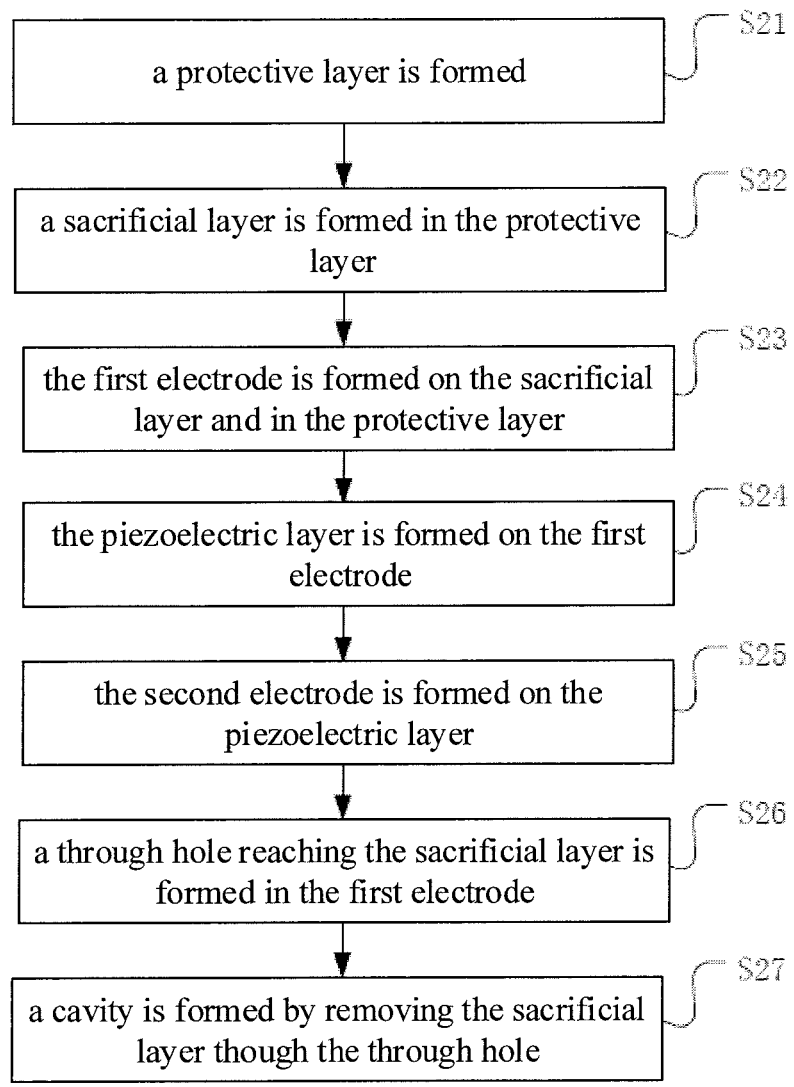
FIG. 4 is a schematic diagram showing a manufacturing method of a MEMS module provided in FIG. 2.

FIG. 2 is a schematic diagram showing a manufacturing method of a MEMS device in accordance with an embodiment of the present disclosure. FIG. 3 is a schematic diagram showing a manufacturing method of the CMOS circuit provided in FIG. 2. FIG. 4 is a schematic diagram showing a manufacturing method of a MEMS module provided in FIG. 2. FIGS. 5A to 5J are schematic cross-sectional diagrams respectively showing a stage of a manufacturing method a MEMS device in accordance with an embodiment of the present disclosure. Hereinafter, the manufacturing method of the MEMS device in accordance with the embodiments of the present disclosure will be described in detail.

As shown in FIG. 2, in step S10, the CMOS circuit is formed, and as shown in FIG. 3, the CMOS circuit can be formed by the following steps S11 to S15.

Figure 5A:
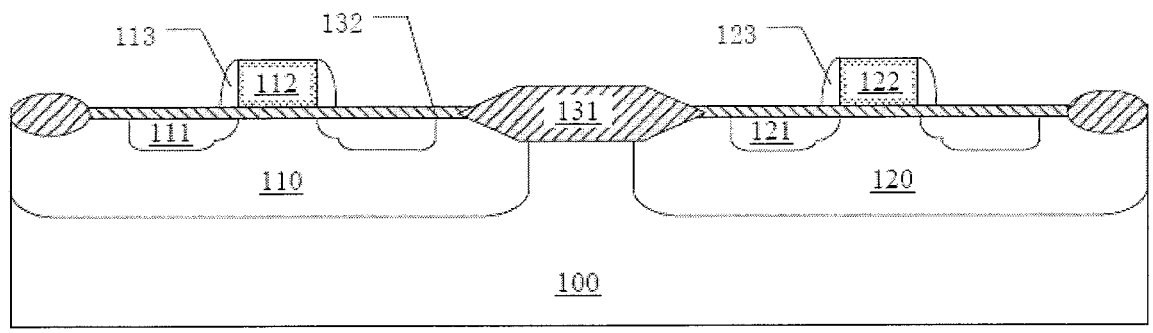
FIGS. 5A to 5J are schematic cross-sectional diagrams respectively showing a stage of a manufacturing method of a MEMS device in accordance with an embodiment of the present disclosure.

In step S11, the first transistor and the second transistor are formed on the substrate. Specifically, as shown in FIG. 5A, the first well region 110 and the second well region 120 are formed in the substrate 100, and the field oxide region 131 between the first well region 110 and the second well region 120 is formed on the substrate 100 by Local Oxidation of Silicon (LOCOS) technology, the gate oxide layer 132 is formed on the substrate 100, the first gate conductor 112 and the second gate conductor 122 which correspond to the first well region 110 and the second well region 120, are formed respectively by depositing polysilicon. In the first well region 110 and the second well region 120, by a photolithography and implantation process, the first source/drain region 111 and the second source/drain region 121 are formed. Silicon dioxide is deposited on the first gate conductor 112 and the second gate conductor 122 and then by adopting a anisotropically etching process so that the first sidewall 113 and the second sidewall 123 are respectively formed on side surfaces of the first gate conductor 112 and the second gate conductor 122. The first well region 110, the first source/drain region 111, the first gate conductor 112 and the first sidewall 113 constitute the first transistor, the second well region 120, the second source/drain region 121, the second gate conductor 122, and the second sidewall 123 constitute the second transistor.

Figure 5B:
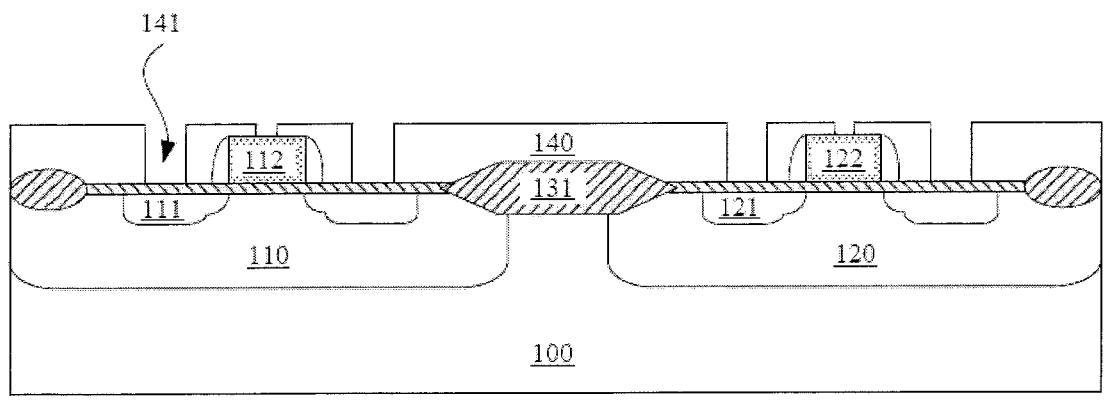

In step S12, the first dielectric layer is formed on the first transistor and on the second transistor. Specifically, as shown in FIG. 5B, the first dielectric layer 140 is deposited on the first transistor and the second transistor, and the plurality of first interconnecting holes 141 are formed in the dielectric layer 140, wherein the material of the first dielectric layer 140 comprise borophosphosilicate glass.

Figure 5C:
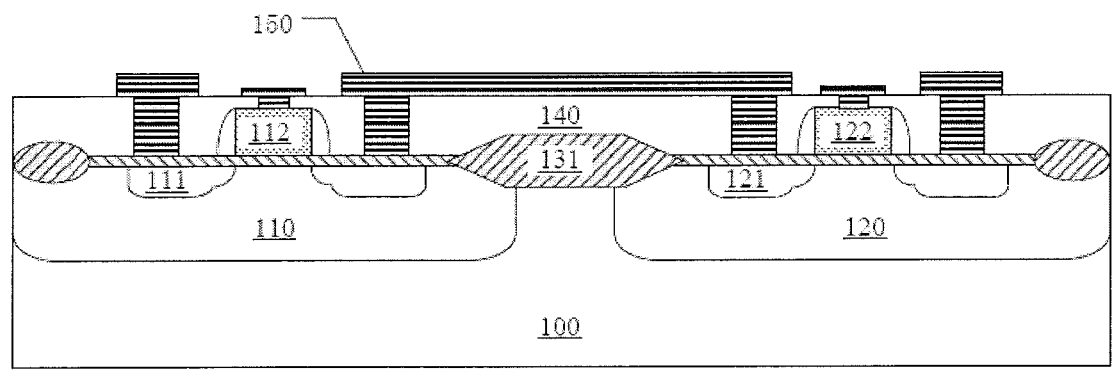

In step S13, the plurality of first interconnecting leads are formed on the first dielectric layer. Specifically, as shown in FIG. 5C, a first wiring layer is formed on the first dielectric layer 140, and the first wiring layer is patterned to form the plurality of first interconnecting leads 150, each one of one portion of the first interconnecting leads 150 contacts the first transistor through one of the plurality of first interconnecting holes, and each one of the other portion of the first interconnecting leads 150 contacts the second transistor through one of the plurality of first interconnecting holes, so that the first transistor and the second transistor are coupling by use of one of the plurality of first interconnecting leads 150, wherein the material of the first interconnecting leads 150 comprises aluminum.

Figure 5D:
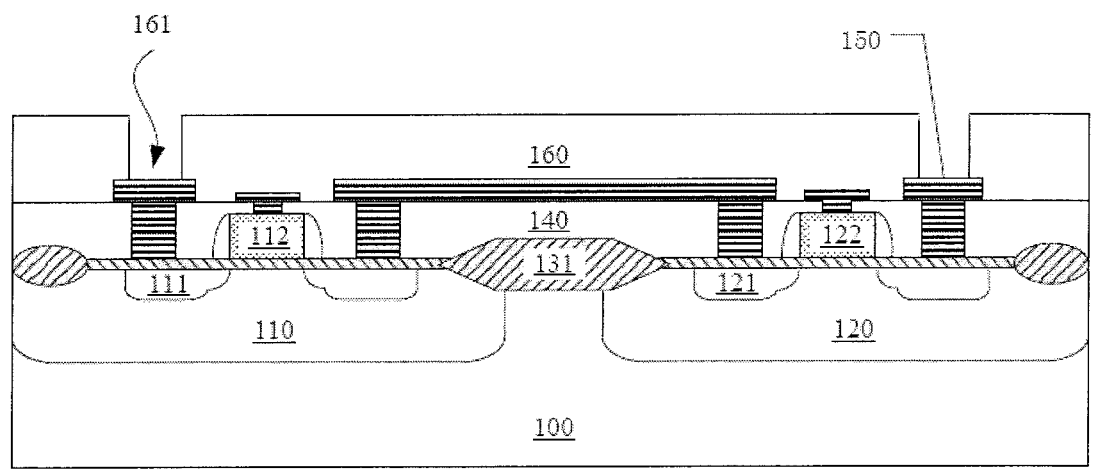

In step S14, the second dielectric layer is formed on the plurality of first interconnecting leads. Specifically, as shown in FIG. 5D, the second dielectric layer 160 is deposited on the plurality of first interconnecting leads 150, and in the second dielectric layer 160, a plurality of second interconnecting holes 161 are formed, wherein the material of the second dielectric layer 160 comprises borophosphosilicate glass.

Figure 5E:
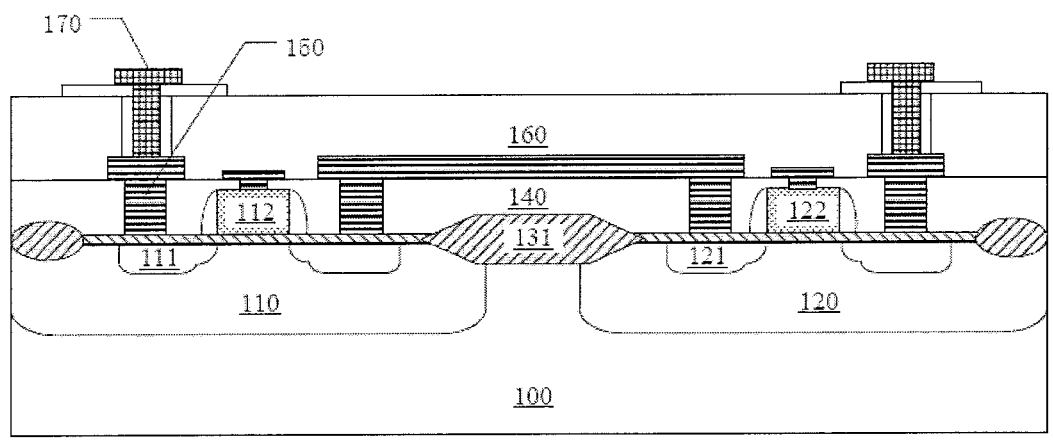

In step S15, the plurality of second interconnecting leads are formed on the second dielectric layer. Specifically, as shown in FIG. 5E, a second wiring layer is formed on the second dielectric layer 160, and the second wiring layer is patterned to form the plurality of second interconnecting leads 170, each one of one portion of the second interconnecting leads 170 contacts one of the plurality of first interconnecting leads 150 through one of the plurality of second interconnecting holes to connect the first transistor, and the each one of the other portion of the second interconnecting leads 170 contacts the first interconnecting leads 150 through one of the plurality of second interconnecting holes to connect to the second transistor, wherein the material of the second interconnecting leads 170 comprises aluminum.

As shown in FIG. 2, in step S20, the MEMS module is formed, and as shown in FIG. 4, the MEMS module can be formed by the following steps S21 to S27.

Figure 5F:
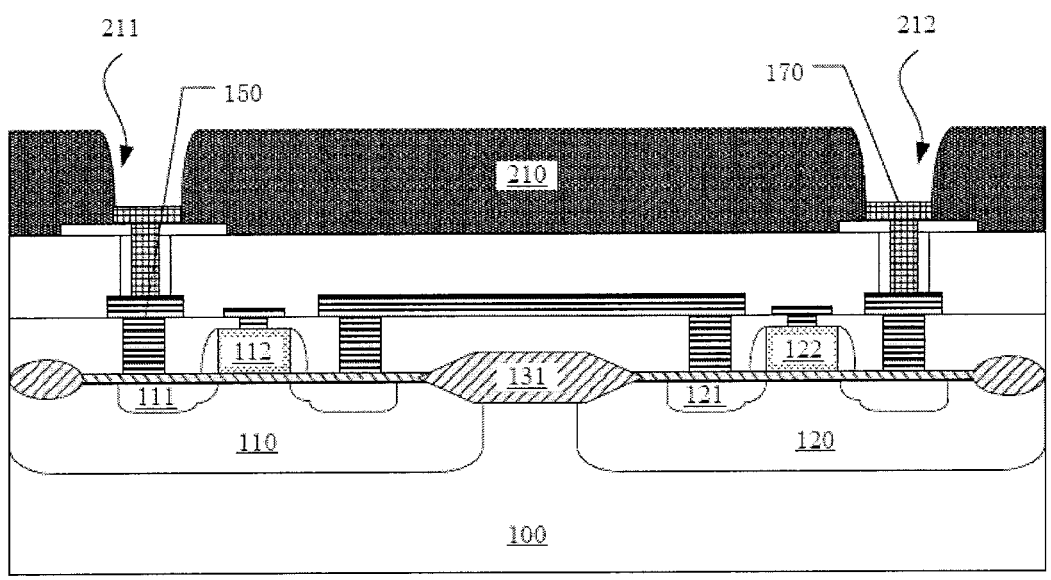

In step S21, a protective layer is formed. Specifically, as shown in FIG. 5F, the protective layer 210 is formed on the second dielectric layer 160 and the second interconnecting leads 170, and the first contact hole 211 and the second contact hole 212 are formed in the protective layer 210, so that the second interconnecting leads 170 are exposed, that is, one end of the second interconnecting lead 170 is coupling to the first interconnecting lead 150 through the second interconnecting hole, and the other end of the second interconnecting lead 170 extends into the first contact hole 211 and the second contact hole 212. The protective layer 210 has an etching ratio greater than silicon dioxide, the material of the protective layer 210 comprises silicon nitride, and the protective layer 210 has a thickness greater than 2 μm.

Figure 5G:
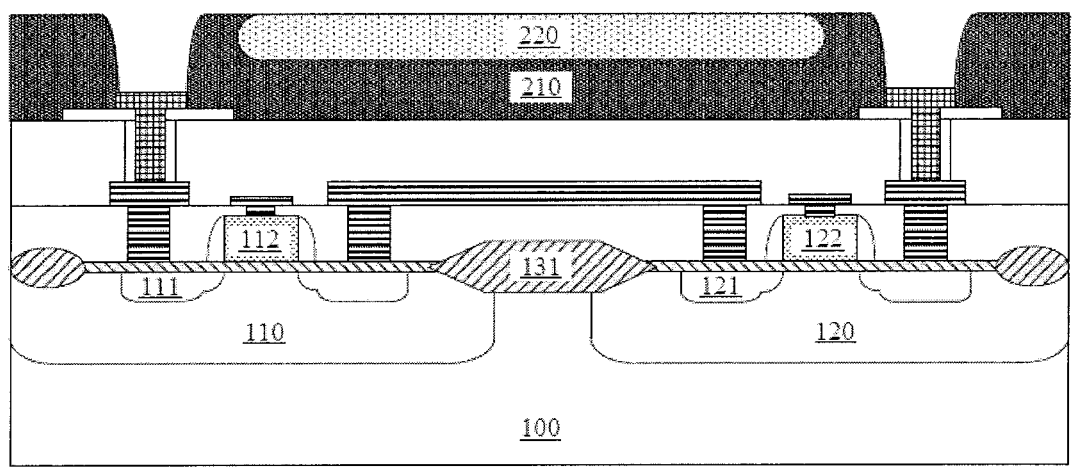

In step S22, a sacrificial layer is formed in the protective layer. Specifically, as shown in FIG. 5G, an opening is formed in the protective layer 210 by a dry etching process, then sacrificial material is filled into the opening to form the sacrificial layer 220 by use of a chemical vapor deposition (CVD) method, then the sacrificial material that is in the outside the opening is removed by a chemical mechanical polishing process, wherein a sacrificial material is preferably a phosphosilicate glass (PSG), and the sacrificial layer 220 has a thickness ranging from 1 to 1.5 μm.

Figure 5H:
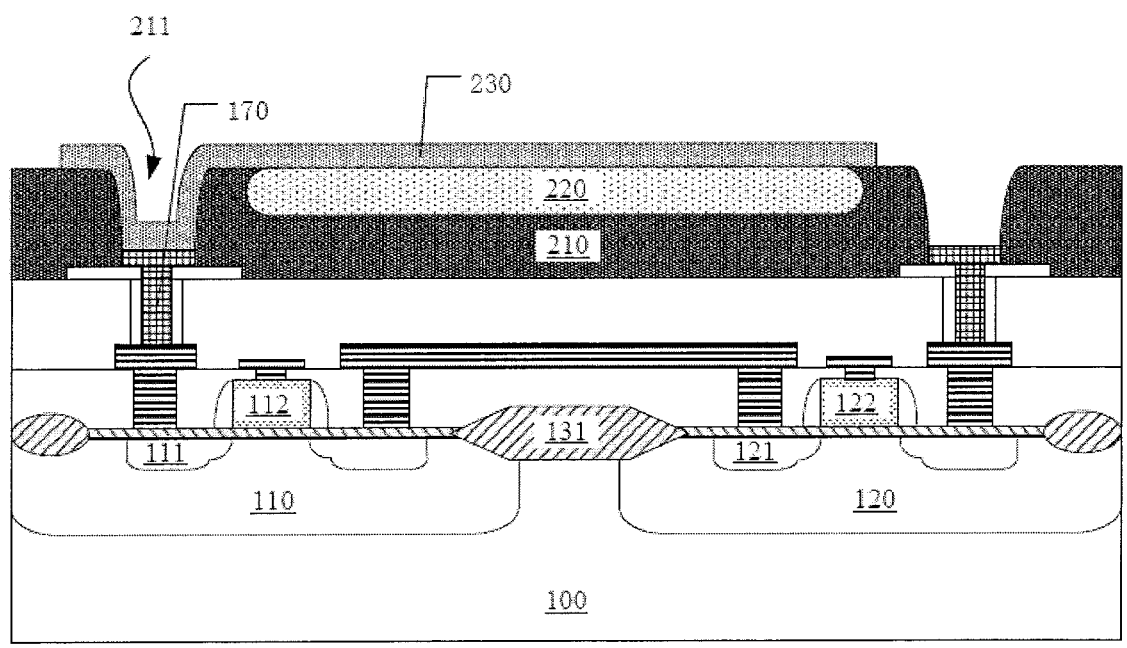

In step S23, the first electrode is formed on the sacrificial layer and in the protective layer. Specifically, as shown in FIG. 5H, a first conductive layer is formed on the protective layer 210 and the sacrificial layer 220 by a sputtering process. The first conductive layer is patterned to form the first electrode 230 by use of a lithography etching process, wherein a part of the first electrode 230 is in contact with the second interconnecting lead 170 in the first contact hole 211, so that the first electrode 230 is electrically coupling to the first transistor. The first electrode 230 covers the sacrificial layer 220, the material of the first electrode 230 is preferably molybdenum. Preferably, the first electrode 230 has a thickness of 0.5 μm. In order to prevent the PN junction from diffusing in the CMOS circuit, the sputtering temperature is less than 450° C.

Figure 5I:
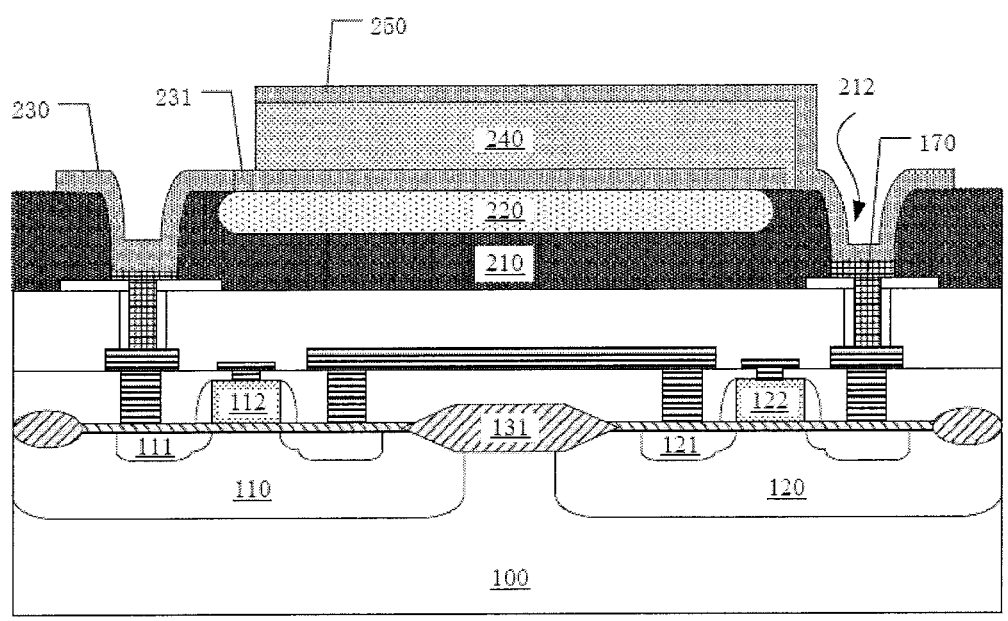

In step S24, the piezoelectric layer is formed on the first electrode. Specifically, as shown in FIG. 5I, a piezoelectric thin film material is sputtered on the first electrode 230, and the piezoelectric layer 240 is formed by patterning the piezoelectric thin film by use of the photolithography etching process and above the sacrificial layer 220, wherein the material of the piezoelectric layer 240 is preferably aluminum nitride, and its thickness is determined by the frequency of a resonant unit.

In step S25, the second electrode is formed on the piezoelectric layer. Specifically, as shown in FIG. 5I, the second conductive layer is formed on the protective layer 210 and the piezoelectric layer 240, and the second electrode 250 is formed by patterning the second piezoelectric layer 240 by use of the photolithography etching process, wherein the second electrode 250 is separated from the first electrode 230 by the piezoelectric layer 240, and a part of the second electrode 250 is in the second contact hole 212 and contacts the second interconnecting lead 170, so that the second electrode 250 is electrically coupling to the second transistor, the material of the second electrode 250 is preferably molybdenum and the thickness of the second electrode 250 is less than 0.5 μm.

In step S26, a through hole reaching the sacrificial layer is formed in the first electrode. Specifically, as shown in FIG. 5I, a through hole 231 reaching the sacrificial layer 220 is formed in the first electrode 230 by the photolithography etching process.

Figure 5J:
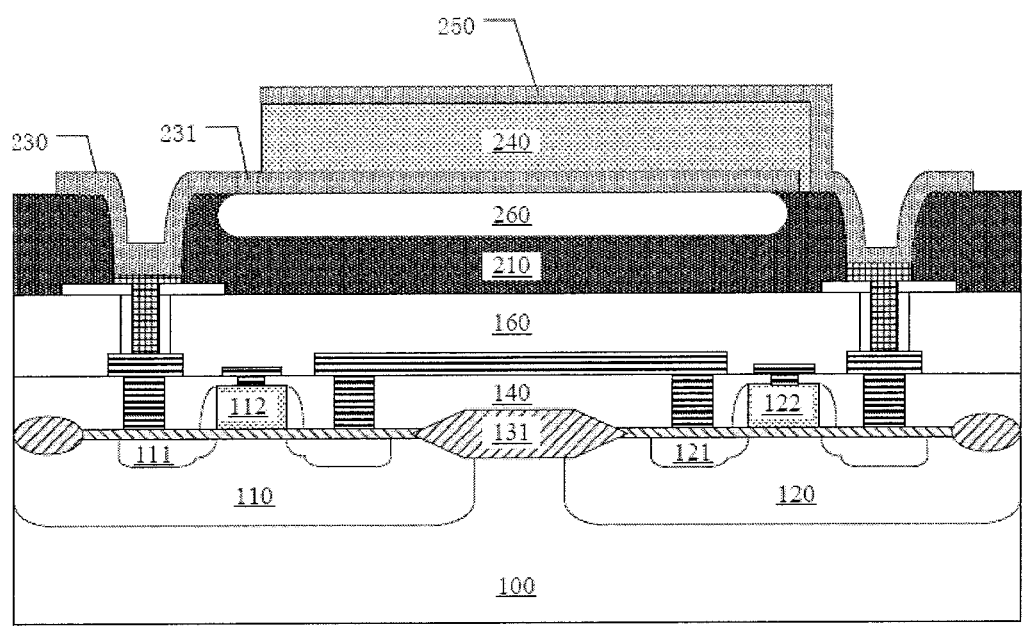

In step S27, a cavity is formed by removing the sacrificial layer though the through hole. Specifically, as shown in FIG. 5J, a MEMS device as shown in FIG. 1 is formed by removing the sacrificial layer 220 through the through hole 231 by use of a hydrofluoric acid vapor phase fumigation process.

In some other embodiments, the patterned first electrode 230 exposes a part of the protective layer 210, then the through hole is formed by etching the protective layer 210 while the first electrode layer 230 is avoided, finally a cavity is formed by removing the sacrificial layer 220 though the through hole, and the MEMS device as shown in FIG. 1 is realized.

According to the MEMS device provided by the embodiments of the disclosure, the integrated structure of the CMOS circuit and the MEMS device at the vertical direction of the single chip is formed by stacking the MEMS module on the COMS circuit, due to no need for adopting eutectic bonding to connect different dies, due to no need for adopting eutectic bonding to connect different dies, the manufacturing process is simplified, the manufacturing cost and total chip size are reduced, which facilities the integration, reduces the power consumption, decreases the number of package pins, and improve the device reliability. In the manufacturing method, by pre-forming the sacrificial layer in the protective layer and removing the sacrificial layer through the through hole on the first electrode or the protective layer after the step of forming the stacked piezoelectric layer, the cavity is formed, so that the shape of the cavity is ensured. Compared with the prior art, this manufacturing method does not affect the shape of the cavity when the stacked piezoelectric layer is formed.

In a preferred embodiment, the MEMS device is a film bulk acoustic wave filter, and the precision of filtered signals is further improved due to the small distance between the COMS circuit and the filter.

The MEMS device manufactured by this method has highly sensitivity, reduced cost, and improved process compatibility.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present disclosure are described above, these embodiments neither present all details, nor imply that the present disclosure is limited to these embodiments. Obviously, many modifications and changes may be made in light of the teaching of the above embodiments. These embodiments are presented and some details are described herein only for explaining the principle of the disclosure and its actual use, so that one skilled person can practice the present disclosure and introduce some modifications in light of the disclosure. The disclosure is intended to cover alternatives, modifications and equivalents that may be included within the spirit and scope of the disclosure as defined by the appended claims.

The invention claimed is:

1. A manufacturing method of a MEMS device, comprising:
   forming a CMOS circuit; and
   forming a MEMS module on the CMOS circuit which is coupling to the MEMS module and configured to drive the MEMS module, wherein,
   the step of forming the MEMS module comprises:
   forming a protective layer;
   forming a first contact hole and the second contact hole in the protective layer;
   forming a sacrificial layer in the protective layer;
   forming a first electrode on the protective layer and on the sacrificial layer so that the first electrode covers the sacrificial layer, and electrically coupling the first electrode to the CMOS circuit;
   forming a piezoelectric layer on the first electrode and above the sacrificial layer;
   forming a second electrode on the piezoelectric layer and electrically coupling the second electrode to the CMOS circuit;
   forming a through hole in the first electrode or in the protective layer to reach the sacrificial layer; and
   forming a cavity by removing the sacrificial layer through the through hole,
   wherein, the step of forming the CMOS circuit comprises:
   forming a plurality of second interconnecting holes in a second dielectric layer, and patterning a second wiring layer on the second dielectric layer to form a plurality of second interconnecting leads each of which has one end in one of the plurality of second interconnecting holes and the other end extending into the first contact hole and the second contact hole,
   the first electrode is electrically coupling to the CMOS circuit through the first contact hole, and the second electrode is electrically coupling to the CMOS circuit through the second contact hole.

2. The manufacturing method according to claim 1, wherein the step of forming the sacrificial layer comprises:
forming an opening in the protective layer;
filling the opening with a sacrificial material; and
removing a part of the sacrificial material that is outside the opening.

3. The manufacturing method according to claim 2, wherein the sacrificial material comprises phosphosilicate glass.

4. The manufacturing method according to claim 1, wherein, the step of forming the first electrode comprises:
forming a first conductive layer on the protective layer and on the sacrificial layer; and
patterning the first conductive layer to form the first electrode,
wherein a part of the first electrode is located in the first contact hole.

5. The manufacturing method according to claim 4, wherein, the step of forming the second electrode comprises:
forming a second conductive layer on the protective layer and on the piezoelectric layer;
patterning the second conductive layer to form the second electrode,
wherein a part of the second electrode is located in the second contact hole.

6. The manufacturing method according to claim 1, wherein the step of forming the cavity comprises: removing the sacrificial layer though the through hole by a hydrofluoric acid vapor phase fumigation process.

7. The manufacturing method according to claim 6, wherein, the piezoelectric layer covers a part of the first electrode and exposes the through hole.

8. The manufacturing method according to claim 5, wherein the step of forming the CMOS circuit comprises:
forming a first transistor and a second transistor on a substrate; and
sequentially forming a first dielectric layer, a first wiring layer, the second dielectric layer and the second wiring layer on the first transistor and the second transistor.

9. The manufacturing method according to claim 8, wherein, the step of forming the CMOS circuit further comprises: forming a plurality of first interconnecting holes in the first dielectric layer before the step of forming the first wiring layer, and
the step of forming the CMOS circuit further comprises:
patterning the first wiring layer to form a plurality of first interconnecting leads each of which contacts the first transistor or the second transistor through one of the plurality of first interconnecting holes after the step of forming the first wiring layer.

10. The manufacturing method according to claim 9, each of the plurality of second interconnecting leads has one end connecting to one of the plurality of first interconnecting leads through one of the plurality of second interconnecting holes.

11. The manufacturing method according to claim 9, wherein the first transistor and the second transistor are coupling by one of the plurality of first interconnecting leads.

12. The manufacturing method according to claim 1, wherein the protective layer has an etching ratio greater than that of silicon dioxide.

13. The manufacturing method according to claim 1, wherein a material of the protective layer comprises silicon nitride.

14. The manufacturing method according to claim 1, wherein the protective layer has a thickness of more than 2 μm.

15. The manufacturing method according to claim 1, wherein the cavity has a depth ranging from 1 to 1.5 μm.

16. The manufacturing method according to claim 1, wherein, a material of the first electrode and the second electrode comprises molybdenum, and
a material of the piezoelectric layer comprises aluminum nitride.

17. The manufacturing method according to claim 1, wherein the first electrode has a thickness ranging from 0.5 to 0.8 μm, and
the second electrode has a thickness less than or equal to 0.5 μm.

18. The manufacturing method according to claim 1, wherein the MEMS device comprises a film bulk acoustic wave filter.

19. A MEMS device comprising:
a CMOS circuit;
a MEMS module being located on the CMOS circuit which is coupling to the MEMS module and configured to drive the MEMS module, wherein,
the MEMS module comprises:
a protective layer on the CMOS circuit, the protective layer has a first contact hole and the second contact hole;
a cavity being located in the protective layer;
a first electrode being located on the protective layer and the cavity, which is electrically coupling to the CMOS circuit and covers the cavity;
a piezoelectric layer being located on the first electrode and above the cavity;
a second electrode being located on the piezoelectric layer and being electrically coupling to the CMOS circuit; and
a through hole being located in the protective layer or in the first electrode to reach the cavity,
wherein the piezoelectric layer exposes the through hole,
the CMOS circuit comprises: a plurality of second interconnecting holes in a second dielectric layer, and a plurality of second interconnecting leads which has one end in one of the plurality of second interconnecting holes and the other end extending into the first contact hole and the second contact hole,
the first electrode is electrically coupling to the CMOS circuit through the first contact hole, and the second electrode is electrically coupling to the CMOS circuit through the second contact hole.

20. The MEMS device according to claim 19,
a part of the first electrode is located in the first contact hole,
a part of the second electrode is located in the second contact hole.

21. The MEMS device according to claim 19, wherein the CMOS circuit comprises:
a substrate;
a first transistor and a second transistor being located on the substrate;
a first dielectric layer being located on the first transistor and on the second transistor;
a plurality of first interconnecting leads being located on the first dielectric layer;
the second dielectric layer being located on the plurality of first interconnecting leads; and
the plurality of second interconnecting leads being located on the second dielectric layer.

22. The MEMS device according to claim 21, wherein, the first dielectric layer has a plurality of first interconnecting holes, and each of the first interconnecting leads contact the first transistor or the second transistor through one of the plurality of first interconnecting holes, each of the plurality of second interconnecting leads has one end connecting with one of the plurality of first interconnecting leads through one of the plurality of second interconnecting holes.

23. The MEMS device according to claim 22, wherein the first transistor and the second transistor are coupling by one of the plurality of first interconnecting leads.

24. The MEMS device according to claim 19, wherein the protective layer has an etching ratio greater than that of silicon dioxide.

25. The MEMS device according to claim 19, wherein a material of the protective layer comprises silicon nitride.

26. The MEMS device according to claim 19, wherein the protective layer has a thickness greater than 2 μm.

27. The MEMS device according to claim 19, wherein the cavity has a depth ranging from 1 to 1.5 μm.

28. The MEMS device according to claim 19, wherein, a material of the first electrode and the second electrode comprises molybdenum, and a material of the piezoelectric layer comprises aluminum nitride.

29. The MEMS device according to claim 19, wherein, the first electrode has a thickness of 0.5 μm, and the second electrode has a thickness less than 0.5 μm.

30. A MEMS device according to claim 19, wherein the MEMS device is a film bulk acoustic wave filter.

* * * * *